United States Patent [19]

Sakurai et al.

[11] Patent Number: 4,682,306
[45] Date of Patent: Jul. 21, 1987

[54] SELF-REFRESH CONTROL CIRCUIT FOR DYNAMIC SEMICONDUCTOR MEMORY DEVICE

[75] Inventors: Takayasu Sakurai, Tokyo; Tetsuya Iizuka, Funabashi, both of Japan

[73] Assignee: Kabushiki Kaisha Toshiba, Kawasaki, Japan

[21] Appl. No.: 767,602

[22] Filed: Aug. 20, 1985

[30] Foreign Application Priority Data

Aug. 20, 1984 [JP] Japan ................................ 59-172754

[51] Int. Cl.⁴ .............................................. G11C 7/00
[52] U.S. Cl. ................................................... 365/222
[58] Field of Search .................. 365/222, 149; 368/189

[56] References Cited

U.S. PATENT DOCUMENTS 4,491,938 1/1985 Leach ................................... 365/222

FOREIGN PATENT DOCUMENTS 59-56291 3/1984 Japan .

OTHER PUBLICATIONS

Kawamoto et al., "A 288Kb CMOS Pseudo SRAM", IEEE International Solid-State Circuits Conference, pp. 276-277, Feb. 24, 1984.

*Primary Examiner*—Joseph A. Popek
*Attorney, Agent, or Firm*—Finnegan, Henderson, Farabow, Garrett & Dunner

[57] ABSTRACT

A self-refresh control circuit for a dynamic memory device having memory cells and a self-refresh circuit on a single chip. The circuit includes a leak current monitor circuit representing the leakage of a memory cell and an inverter circuit for detecting the leakage of the monitor circuit so as to control the refresh operation automatically.

6 Claims, 6 Drawing Figures

SELF-REFRESH CONTROL CIRCUIT FOR DYNAMIC SEMICONDUCTOR MEMORY DEVICE

BACKGROUND OF THE INVENTION

1. Field of the Invention

This invention relates to a self-refresh control circuit for a semiconductor memory device, particularly a Dynamic Random Access Memory device (DRAM).

2. Description of the Prior Art

Recent advances in semiconductor dynamic memory device technology provide a self-refresh circuit on a single semiconductor chip having memory cells which can perform a self-refresh operation automatically and eliminate the timing or address control circuit formerly required outside the chip.

In general, this type of self-refresh circuit comprises an oscillator and a refresh address counter, which is provided for designating the address of memory cells during the refresh operation when the memory cells are on standby operation or not in the read or write mode.

In these circuits, the oscillator circuit which determines the frequency of the refresh operation is constructed using MOS-FETs. Generally, the operation of MOS-FETs becomes slower as the temperature of the device increases. Therefore, the frequency of the oscillator decreases in high temperature.

On the other hand, the current leakage of a memory cell increases roughly by a factor of two when the temperature rises by ten degrees. Accordingly, the frequency of the oscillator should be high enough so as to operate satisfactorily even in a high temperature environment. This results in the frequency of the refresh operation at low temperatures being higher than needed.

Further, because integrated circuits are manufactured through use of various processes, the characteristics of the circuits may vary. Therefore, it is necessary to set up the frequency of the oscillator with enough margin to compensate for those variations.

Accordingly, in general, the frequency of the oscillator is generally set to be 100 times the frequency needed in ordinary temperature conditions.

A refresh operation consumes a certain amount of power. For example, 256K DRAM consumes several milliamperes of current on standby operation. Because of this high power consumption, it is very difficult to operate a DRAM using a dry battry as a power source.

In order to eliminate these disadvantages, Japanese Laid Open Patent No. 59-56291 provides a memory device which automatically controls the frequency of the refresh operation so as to reduce the power consumption. This refresh control circuit comprises two leak current monitor capacitors, each of which is precharged to some respective predetermined level, and a voltage comparator circuit for detecting the voltage difference between the two capacitors and causing a refresh operation.

However, this refresh control circuit has following disadvantages. First, it is very difficult to design the characteristics of two capacitors, such as current leakage time or initial charge voltage, to simulate the current leakage of memory cells because the leak current monitoring system does not detect the current leakage time of the capacitor itself, but instead detects the difference between the voltages on the two capacitors. Therefore, unless the characteristics of the capacitor's are selected correctly, it is not possible to exactly monitor the current leakage time of the memory cells. Second, because the comparator circuit has a current flowing through it, it consumes power. This reduces the primary advantages of the circuit.

SUMMARY OF THE INVENTION

It is an object of the present invention to provide a self-refresh control circuit for a dynamic semiconductor memory device in which the power consumption of the memory device when it is on standby can be minimized.

It is yet another object of the present invention to provide a self-refresh control circuit in which the power consumption of the control circuit can be reduced.

It is still another object of the present invention to provide a self-refresh control circuit in which the stored information in a DRAM can be maintained by a dry battery voltage source.

The present invention provides a novel, advanced self-refresh control circuit, in which an inverter circuit, such as a CMOS inverter or a precharge-discharge type inverter, detects the voltage level of a capacitor which is designed to have characteristics similar to a memory cell. When the voltage of the capacitor decreases to a predetermined level, the inverter generates a signal which triggers a refresh operation, controls the interval of intermittent refresh operations, and controls the frequency of the refresh operations.

DETAILED DESCRIPTION OF THE PREFERRED EMBODIMENT

Figure 1:
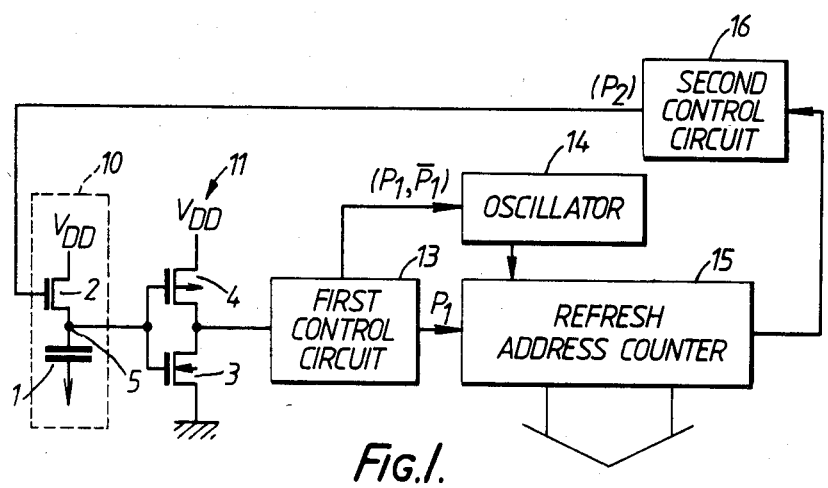
FIG. 1 shows a block diagram of a preferred embodiment of the invention.

The automatic self-refresh control circuit of a dynamic memory, shown in FIG. 1, includes one capacitor 1 serially connected to one transfer gate 2.

The circuit comprises leak current monitor circuit 10 having a capacitor 1 serially connected between a transfer gate 2 which is, in this embodiment, an N-type MOS device, and a constant voltage terminal (in this embodiment, an earth terminal).

CMOS inverter circuit 11 connected to the capacitor 1 has a N-type MOS transistor 3 and P-type MOS transistor 4 whose conductance is larger than 3. The threshold voltage Vth of this circuit is designed to be larger than $\frac{1}{2}$ $V_{DD}$ by a predetermined level according to the difference of the conductance of the transistors 3 and 4.

A first control circuit 13 receives the output signal of the CMOS inverter circuit and waveshapes the signal. The first control circuit 13 may be constructed from, for example, an even number of inverter circuits serially connected. Signals P, and $\bar{P}$, are taken from the outputs of successive inverters. Those signals are applied to a self-excited oscillator 14, which begins to oscillate when it receives the signals. Output signal $P_1$ is also supplied to a refresh address counter 15.

Refresh address counter 15 is reset by the output signal $P_1$ from the control circuit 13 and then counts the output signal from the oscillator 14. Refresh address counter 15 generates a refresh address signal which is sent to a row decoder (not shown) which selectively drives a word line.

A second control circuit 16 receives an overflow signal from the refresh address counter 15, which is generated when the count in the refresh address counter 15 exceeds the number of word lines present. Second control circuit 16 may be, for example, two inverters connected serially, with the second inverter circuit having a higher voltage source than the first. When the second control circuit 16 receives the overflow signal, it generates a pulse having a constant voltage and width. This pulse signal is sent to the transfer gate 2 and switches the gate to the ON state. When the gate 2 is in the ON state, capacitor 1 is recharged.

Figure 2:
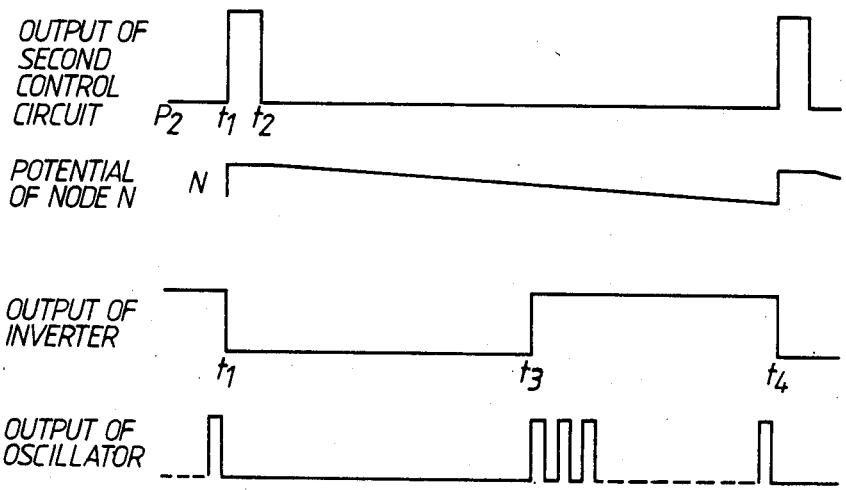
FIG. 2 shows a timing chart diagram of the circuit of FIG. 1.

Referring to FIG. 2, the operation of the circuit will be described. First, the output signal of the second control circuit 16 ($P_2$) causes the transfer gate 2 to be in the ON state between time $t_1$ and $t_2$ and charge the capacitor 1. The connection point of transfer gate 2 and capacitor 1, i.e. node 5, is charged to a "1" level.

The voltage level of node 5 represents the leakage of a memory cell of the dynamic memory. Specifically, if the leakage current of the memory cell is large, the potential level at node 5 becomes zero correspondingly faster. If the leakage current of the memory cell is small, it will take longer for the potential at node 5 to reach zero. At time $t_3$, when the potential level of node 5 decreases under the threshold voltage $V_{th}$ of inverter circuit 11, the output signal of the inverter circuit 11 changes to "1" level from "0" level. This output signal is waveshaped by the first control circuit 13, as previously explained. The output signal of the control circuit 13 causes the refresh address counter 15 to be reset and the oscillator 14 to start.

Accordingly, the oscillator 14 begins to generate pulse signals, which are counted by the refresh address counter 15 in order to determine the refresh addresses. During this time, the memory cells are refreshed by the refresh circuit (not shown). At the time $t_4$, when the counter 15 overflows, an overflow signal in the form of a pulse signal is applied to the second control circuit 16, which generates a pulse signal $P_2$ having a constant width upon receipt of the overflow signal. This output signal $P_2$ causes the transfer gate 2 to turn on and charge the capacitor 1 once again.

In the above described system, it is necessary that the time during which the potential level of node 5 in the leak current monitor circuit 10 declines to the $V_{th}$ level, the threshold voltage of the CMOS inverter circuit 11, be shorter than the time during which the information stored in the capacitors of the memory cell is lost. For this purpose, the threshold voltage $V_{th}$ of the CMOS inverter circuit 11 is designed to be higher than $\frac{1}{2} V_{DD}$.

According to this embodiment of the invention, the refresh operation is performed more often if the leak current of the memory cells is large. If the leak current of the memory cells is small, the refresh operation is performed less frequently. Therefore, it is possible to control the time between refresh operations to an optimum value by monitoring the leak current of a memory cell.

In addition, it is unnecessary to have a refresh frequency with a high margin of error to compensate for temperature or process variations. Consequently, the refresh frequency can be about 1/100 that of a conventional refresh circuit. Therefore, the power consumed during the stand-by state is minimized. In addition, because there is no direct current path through the CMOS inverter circuit 11, the power consumption of the circuit is quite small. Therefore, one can provide a DRAM which operates satisfactorily with a dry battery as a power source.

Figure 3:
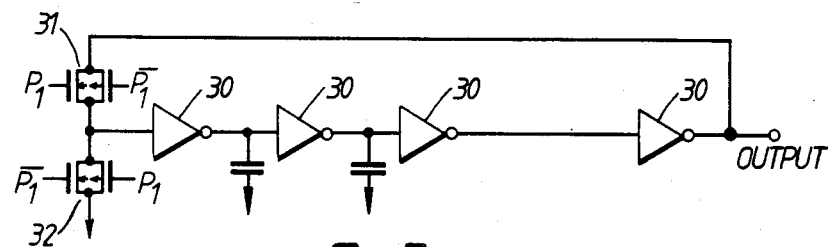
FIG. 3 shows an embodiment of the oscillator circuit of FIG. 1.

FIG. 3 shows an embodiment of oscillator 14. This circuit comprises an odd number of CMOS inverter circuits 30 and CMOS transfer gates 31 and 32. Transfer gates 31 and 32 have inputs receiving complimentary control signals P and $\bar{P}_1$ from the first control circuit 13, as shown. When $P_1$ is "high" and $\bar{P}$ is "low", transfer gate 31 is open and transfer gate 32 is closed. Therefore, a feedback loop is closed between the output of the oscillator circuit and its input. Due to the time delay caused by the inverters and the capacitors connected between them, the circuit acts as an oscillator. Likewise, when $P_1$ is "low" and $\bar{P}_1$ is "high", gate 31 is closed and gate 32 is open and the oscillator does not operate.

The embodiment of FIG. 1 described above shows an example of an intermittent type referesh circuit. Namely, the circuit monitors the voltage on capacitor 1 and starts the oscillator 14 when the voltage decreases under some predetermined level. All the memory cells are then refreshed one after another in response to oscillator 14. Therefore, the refresh operation is performed intermittently, and only when necessary.

Figure 4:
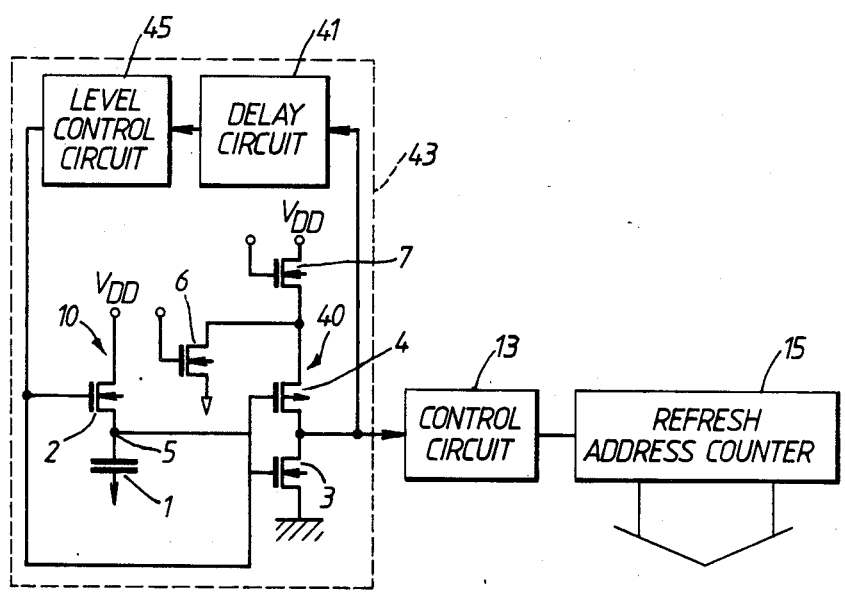
FIG. 4 shows another embodiment of the invention.
Figure 5:
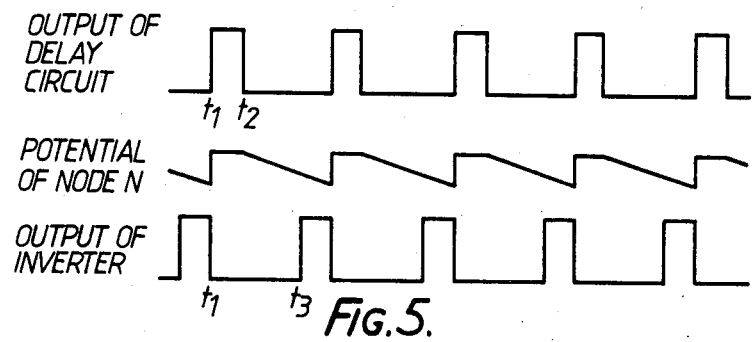
FIG. 5 shows a timing chart diagram of the circuit of FIG. 4.

FIG. 4 represents another embodiment of the present invention. This circuit employs a precharge-discharge type inverter circuit 40 which receives the output signal from the leak monitor circuit 10. The inventer circuit 40 generates a signal to the control terminal of the transfer gate 2 of the leak monitor circuit 10, through a delay circuit 41, which may consist of an even number of inverters, and a level control circuit 45, which operates to assure that the signal is at a proper voltage level, so as to make a closed loop circuit. This circuit operates as an oscillator, and will be described referring to FIG. 5.

From time t1 to t2, the transfer gate 10 is ON and the capacitor 1 is charged. An N-channel transistor 3 is switched ON so that the output of the inverter 40 changes to a "0". This causes the transfer gate 10 to switch OFF. At time t3, when the charge on the capacitor decreases under a predetermined level because of leakage current, the P-channel transistor 4 is switched ON and the output of inverter 40 changes to the "1" state. This "1" signal starts the charging of the capacitor C after the delay generated by the delay circuit 41. The repetition of this cycle represents an oscillation.

In this case, the leakage of the capacitor C corresponds to the leakage of a memory cell. By setting the threshold voltage of the inverter circuit 40 to be sufficiently higher than the voltage at which information stored in a memory cell is lost, it is possible to set the frequency of the oscillator at the value desired for maintaining the information contained in the memory cells. The output signal of the inverter 40 is waveshaped by the control circuit 13 and counted by the refresh address counter 15, as discussed above with respect to FIG. 1.

Inverter 40 includes additional transistors 6 and 7, which are used to control the threshold voltage of the inverter circuit 40.

This precharge-discharge type inverter circuit has an added advantage because the power consumed is smaller than in ordinary inverter circuits. Transistors 4 and 3 are not switched ON at the same time, and no current path is formed between the voltage source, $V_{DD}$, and ground.

The level control circuit 45 is used simply to control the initial charge-up voltage level of node N. This circuit may not be necessary in some applications.

One can design the capacitor 1 so that it will have slightly more leakage current than ordinary memory cell capacitors. For example, the impurity concentration of the surface portion of the semiconductor body, formed as an electrode of the capacitor, may be increased, or a polysilicon conductor formed like a comb may be used as another electrode of the capacitor. This technique helps to perform the refresh operation with enough margin for error to prevent loss of the information contained in the memory cells.

Figure 6:
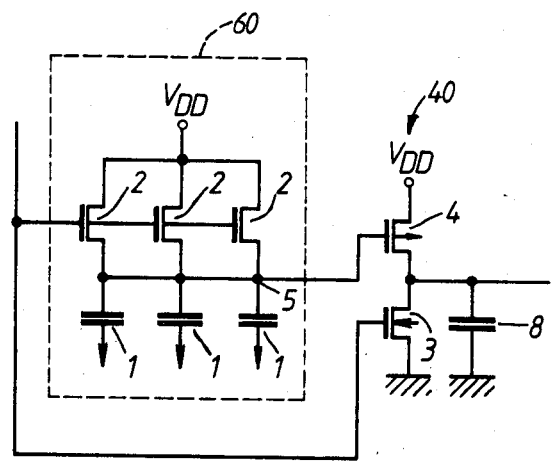
FIG. 6 shows another embodiment of the leak current monitor circuit and inverter circuit of the invention.

FIG. 6 shows another embodiment of the leak monitor circuit according to the present invention. This circuit replaces the leak current monitor circuit 10 and CMOS inverter 11 of FIG. 1. The circuit comprises a leak monitor circuit 60 and a precharge-discharge type inverter 40. The leak monitor circuit 60 may include three monitor cells, each of which has a transfer-gate 2 and a capacitor 1 connected thereto. These monitor cells are conncted in parallel. The node 5 of these cells is connected to the gate electrode of a P-channel transistor 4 of the inverter circuit 40. The gate of a N-channel transistor 3 of the inverter circuit 40 is connected to the input terminal of the leak monitor circuit 60. The capacitor 8 is employed to stablize the potential at the output node of the inverter circuit 40. The remainder of the circuit of FIG. 1 operates as earlier described.

In this embodiment, the number of the monitor capcitors is not limited to three. For example, a hundred capacitors may be available. By increasing the number of the capacitors, one can ignore errors due to the gate capacitance of transistor 4 which monitors the charge stored in the capacitors. It should be noted that the leakage time of the capacitors is not affected by the number of capacitors 1 connected in parallel.

What is claimed is:

1. A self-refresh control circuit for a dynamic semiconductor memory device having a plurality of memory cells, comprising:

leak current monitor means consisting of a capacitor having voltage leakage characteristics similar to those of the memory cells of said memory device to determine the status of the charge of said memory cells;

means connected to said capacitor for charging said capacitor to a predetermined voltage;

an inverter circuit connected at its input to said capacitor for detecting the voltage of said capacitor and providing a refresh signal when said voltage is less than a predetermined minimum level;

refresh timing control means connected to the output of said inverter circuit for controlling a refresh operation for said memory cells in response to said refresh signal; and pulse generating means for detecting when said refresh operation has been completed and then generating a signal to said charging means to cause said charging means to charge said leak current monitor means.

2. A self-refresh control circuit according to claim 1, wherein said refresh timing control means controls the operation of an oscillator, and said oscillator generates pulses applied to an input of a refresh address counter.

3. A self-refresh control circuit according to claim 1, wherein said refresh timing control means controls the frequency of pulses applied to an input of a refresh address counter.

4. A self-refresh control circuit according to claim 1, wherein said refresh timing control means generates a signal for starting a refresh operation.

5. A self-refresh control circuit according to claim 1, wherein said inverter circuit comprises CMOS devices.

6. A self-refresh control circuit according to claim 1, wherein said inverter circuit comprises a precharge-discharge type inverter.

* * * * *